US012613298B2

(12) United States Patent
Gao et al.

(10) Patent No.: US 12,613,298 B2
(45) Date of Patent: Apr. 28, 2026

(54) MAGNETIC RESONANCE SCANNING AND IMAGING METHOD AND MAGNETIC RESONANCE IMAGING SYSTEM

(71) Applicant: GE Precision Healthcare LLC, Waukesha, WI (US)

(72) Inventors: Lei Gao, Beijing (CN); Yongchuan Lai, Beijing (CN)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 183 days.

(21) Appl. No.: 18/639,710

(22) Filed: Apr. 18, 2024

(65) Prior Publication Data

US 2024/0353516 A1 Oct. 24, 2024

(30) Foreign Application Priority Data

Apr. 18, 2023 (CN) .......................... 202310414389.3

(51) Int. Cl.
*G01R 33/56* (2006.01)
*G01R 33/48* (2006.01)

(52) U.S. Cl.
CPC ..... *G01R 33/5608* (2013.01); *G01R 33/4818* (2013.01)

(58) Field of Classification Search
CPC .... G01R 33/56; G01R 33/5608; G01R 33/48; G01R 33/481; G01R 33/4818; G01R 33/58; A61B 5/055
See application file for complete search history.

(56) References Cited

U.S. PATENT DOCUMENTS 5,672,969 A 9/1997 Zhou
2012/0008842 A1* 1/2012 Hinks .............. G01R 33/56554
324/309
2019/0086498 A1* 3/2019 Zheng ................ G01R 33/5612

OTHER PUBLICATIONS

Xu et al., "Robust 2D phase correction for echo planar imaging under a tight field-of-view" Magn Reson Med. Dec. 2010;64(6):1800-13. doi: 10.1002/mrm.22577. Epub Aug. 30, 2010. PMID: 20806354, 14 pages.

* cited by examiner

*Primary Examiner* — Son T Le

(74) *Attorney, Agent, or Firm* — Fletcher Yoder, P.C.

(57) ABSTRACT

A magnetic resonance scanning and imaging method and a magnetic resonance imaging system are provided. The method includes: performing a reference scan on a site to be examined, acquiring reference scan data corresponding to a portion of slice positions among a plurality of slice positions, and generating, according to the reference scan data, a phase correction coefficient corresponding to each slice position among the plurality of slice positions; and performing, according to the phase correction coefficients, a diagnostic scan on the site to be examined to acquire a magnetic resonance image.

17 Claims, 8 Drawing Sheets

401

Perform a reference scan on a site to be examined, acquire reference scan data corresponding to a portion of slice positions among a plurality of slice positions, and generate, according to the reference scan data, a phase correction coefficient corresponding to each slice position among the plurality of slice positions

402

Perform, according to the phase correction coefficients, a diagnostic scan on the site to be examined to acquire a magnetic resonance image

FIG. 4

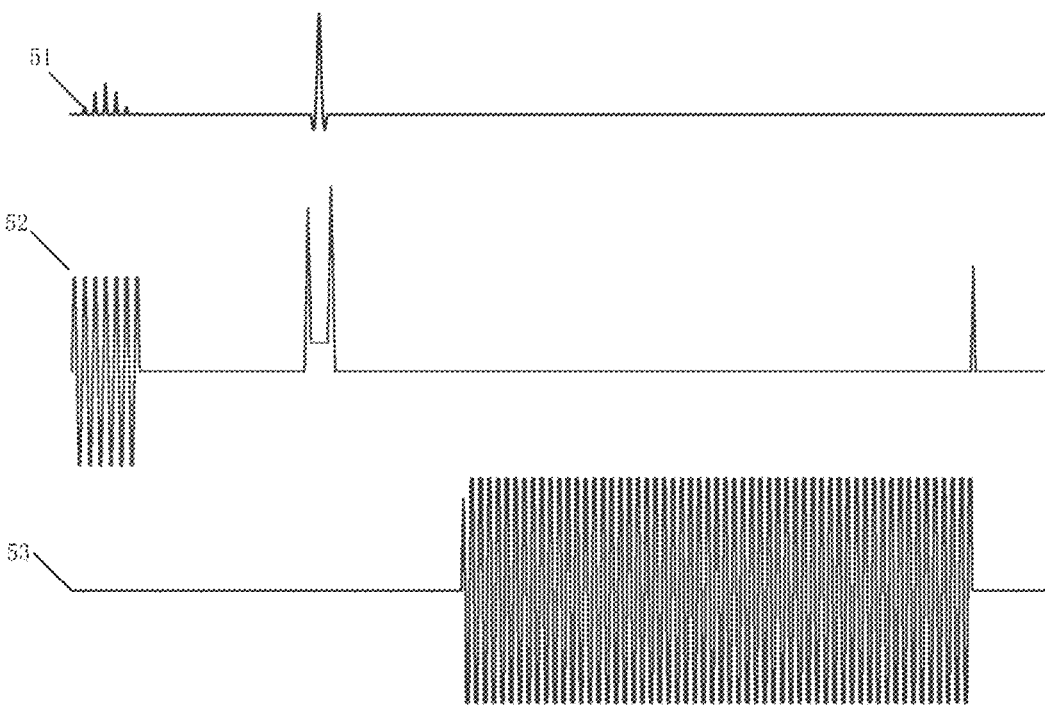

FIG. 5

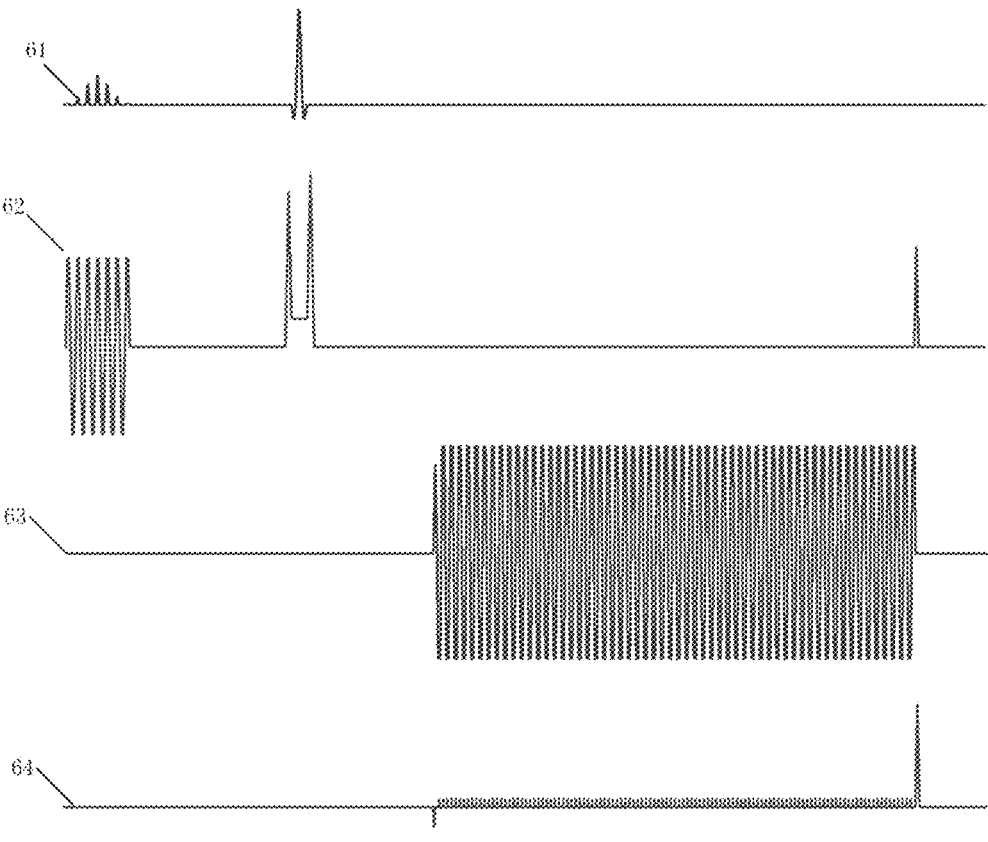

FIG. 6

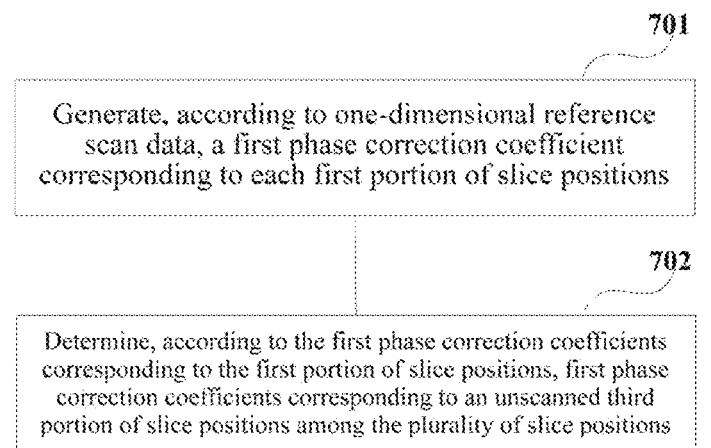

701

Generate, according to one-dimensional reference scan data, a first phase correction coefficient corresponding to each first portion of slice positions

702

Determine, according to the first phase correction coefficients corresponding to the first portion of slice positions, first phase correction coefficients corresponding to an unscanned third portion of slice positions among the plurality of slice positions

FIG. 7

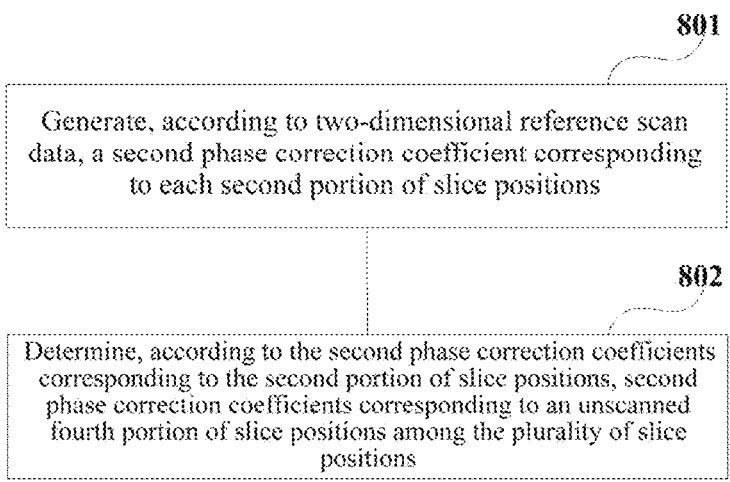

Generate, according to two-dimensional reference scan data, a second phase correction coefficient corresponding to each second portion of slice positions

801

Determine, according to the second phase correction coefficients corresponding to the second portion of slice positions, second phase correction coefficients corresponding to an unscanned fourth portion of slice positions among the plurality of slice positions

MAGNETIC RESONANCE SCANNING AND IMAGING METHOD AND MAGNETIC RESONANCE IMAGING SYSTEM

CROSS REFERENCE TO RELATED APPLICATIONS

The present application claims priority and benefit of Chinese Patent Application No. 202310414389.3 filed on Apr. 18, 2023, which is incorporated herein by reference in its entirety.

TECHNICAL FIELD

Embodiments of the present application relate to the technical field of medical devices, and in particular to a magnetic resonance scanning and imaging method and a magnetic resonance imaging system.

BACKGROUND

Magnetic resonance (MR) imaging systems are widely used in the field of medical diagnostics. Magnetic resonance systems generally have a main magnet, a gradient amplifier, a radio-frequency amplifier, a gradient coil, a transmit chain module, a transmit/receive coil, a receive chain module, etc. The transmit chain module generates a pulse signal and transmits the same to the transmit/receive coil. The transmit/receive coil generates a radio-frequency excitation signal to excite a scanned subject to generate a magnetic resonance signal. After the excitation ends, by means of spatial encoding, the transmit/receive coil acquires the magnetic resonance signal, and the magnetic resonance signal is filled into a k-space, thereby reconstructing a medical image.

Conventional magnetic resonance echo planar imaging (EPI) is a fast acquisition and imaging technique. The EPI technique may use a reverse frequency readout gradient to alternately acquire one or more odd echoes and even echoes. Odd echoes and even echoes in the k-space may respectively correspond to a plurality of MR signals acquired via opposite readout gradient polarities. A polar entire image may be formed by a plurality of echo signals generated after a single radio-frequency excitation, thus enabling fast imaging. However, possibly due to causes such as eddy currents, gradient coil heating, and gradient delays, the EPI technique results in phase inconsistency (alternatively referred to below as a phase error) between odd echoes and even echoes (or between a plurality of MR signals acquired via opposite readout gradient polarities). The presence of phase inconsistency in k-space data generates a Nyquist artifact in a reconstructed image.

SUMMARY

The embodiments of the present application provide a magnetic resonance scanning and imaging method and a magnetic resonance imaging system.

According to an aspect of the embodiments of the present application, a magnetic resonance scanning and imaging method is provided, the method comprises: performing a reference scan on a site to be examined, acquiring reference scan data corresponding to a portion of slice positions among a plurality of slice positions, and generating, according to the reference scan data, a phase correction coefficient corresponding to each slice position among the plurality of slice positions. The method also includes performing, according to the phase correction coefficients, a diagnostic scan on the site to be examined to acquire a magnetic resonance image.

According to an aspect of the embodiments of the present application, a magnetic resonance imaging system is provided. The magnetic resonance imaging system comprises a scanning unit; and a controller, configured to control the scanning unit to perform a reference scan on a site to be examined, acquire reference scan data corresponding to a portion of slice positions among a plurality of slice positions, and generate, according to the reference scan data, a phase correction coefficient corresponding to each slice position among the plurality of slice positions; and perform, according to the phase correction coefficients, a diagnostic scan on the site to be examined to acquire a magnetic resonance image.

One of beneficial effects of the embodiments of the present application is as follows: when a reference scan is performed, the scan does not need to be performed on all slice positions, and only a portion of slice positions are scanned. Scan data of the portion of slice positions is acquired, and phase correction coefficients corresponding to all of the slice positions are obtained according to the scan data of the portion of slice positions, thereby reducing reference scan time while suppressing Nyquist artifacts.

With reference to the following description and drawings, specific implementations of the embodiments of the present application are disclosed in detail, and the means by which the principles of the embodiments of the present application can be employed are illustrated. It should be understood that the implementations of the present application are therefore not limited in scope. Within the scope of the spirit and clauses of the appended claims, the implementations of the present application comprise many changes, modifications, and equivalents.

BRIEF DESCRIPTION OF THE DRAWINGS

The included drawings are used to provide further understanding of the embodiments of the present application, which constitute a part of the description and are used to illustrate the implementations of the present application and explain the principles of the present application together with textual description. Evidently, the drawings in the following description are merely some embodiments of the present application, and a person of ordinary skill in the art may obtain other implementations according to the drawings without involving inventive skill. In the drawings:

FIG. 4 is a schematic diagram of a magnetic resonance scanning and imaging method according to embodiments of the present application;

FIG. 5 is a schematic diagram of a first pulse sequence according to embodiments of the present application;

FIG. 6 is a schematic diagram of a second pulse sequence according to embodiments of the present application;

FIG. 7 is a schematic diagram of a method for determining a first phase correction coefficient according to embodiments of the present application;

FIG. 8 is a schematic diagram of a method for determining a second phase correction coefficient according to embodiments of the present application;

FIG. 9 is a schematic diagram of a third gradient pulse and a fourth gradient pulse according to embodiments of the present application;

DETAILED DESCRIPTION

The foregoing and other features of the embodiments of the present application will become apparent from the following description and with reference to the drawings. In the description and drawings, specific implementations of the present application are disclosed in detail, and part of the implementations in which the principles of the embodiments of the present application may be employed are indicated. It should be understood that the present application is not limited to the described implementations. On the contrary, the embodiments of the present application include all modifications, variations, and equivalents which fall within the scope of the appended claims.

In the embodiments of the present application, the terms "first" and "second" etc., are used to distinguish different elements, but do not represent a spatial arrangement or temporal order, etc., of these elements, and these elements should not be limited by these terms. The term "and/or" includes any and all combinations of one or more associated listed terms. The terms "comprise", "include", "have", etc., refer to the presence of described features, elements, components, or assemblies, but do not exclude the presence or addition of one or more other features, elements, components, or assemblies.

In the embodiments of the present application, the singular forms "a" and "the", etc. include plural forms, and should be broadly construed as "a type of" or "a class of" rather than being limited to the meaning of "one". Furthermore, the term "the" should be construed as including both the singular and plural forms, unless otherwise specified in the context. In addition, the term "according to" should be construed as "at least in part according to . . ." and the term "on the basis of" should be construed as "at least in part on the basis of . . . ", unless otherwise specified in the context.

The features described and/or illustrated for one implementation may be used in one or more other implementations in the same or similar manner, be combined with features in other embodiments, or replace features in other implementations. The term "include/comprise" when used herein refers to the presence of features, integrated components, steps, or assemblies, but does not preclude the presence or addition of one or more other features, integrated components, steps, or assemblies.

Figure 1:
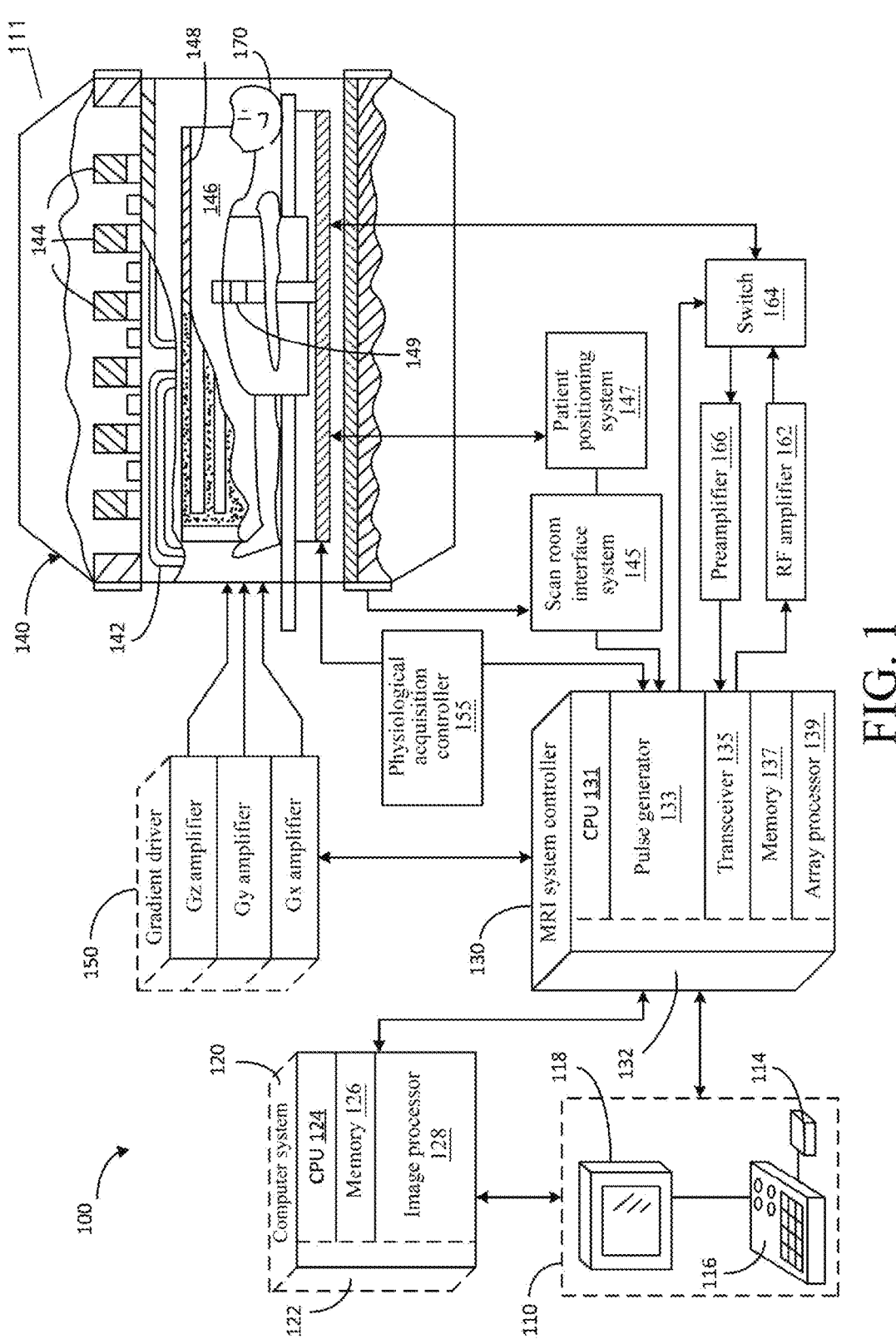
FIG. 1 is a schematic diagram of a magnetic resonance imaging system according to embodiments of the present application.

For ease of understanding, FIG. 1 shows a magnetic resonance imaging (MRI) system 100 according to some embodiments of the present invention.

The MRI system 100 includes a scanning unit 111. The scanning unit 111 is used to perform a magnetic resonance scan of a subject (e.g., a human body) 170 to generate image data of a region of interest of the subject 170, wherein the region of interest may be a predetermined anatomical site or anatomical tissue.

The operation of the MRI system 100 is controlled by an operator workstation 110 that includes an input device 114, a control panel 116, and a display 118. The input device 114 may be a joystick, a keyboard, a mouse, a trackball, a touch-activated screen, voice control, or any similar or equivalent input device. The control panel 116 may include a keyboard, a touch-activated screen, voice control, a button, a slider, or any similar or equivalent control device. The operator workstation 110 is coupled to and in communication with a computer system 120 that enables an operator to control the generation and display of images on the display 118. The computer system 120 includes various components that communicate with one another via an electrical and/or data connection module 122. The connection module 122 may be a direct wired connection, a fiber optic connection, a wireless communication link, etc. The computer system 120 may include a central processing unit (CPU) 124, a memory 126, and an image processor 128. In some embodiments, the image processor 128 may be replaced by image processing functions implemented in the CPU 124. The computer system 120 may be connected to an archive media apparatus, a persistent or backup memory, or a network. The computer system 120 may be coupled to and communicates with a separate MRI system controller 130.

The MRI system controller 130 includes a set of components that communicate with one another via an electrical and/or data connection module 132. The connection module 132 may employ a direct wired connection, a fiber optic connection, a wireless communication link, etc. The MRI system controller 130 may include a CPU 131, a sequence pulse generator 133 which is in communication with the operator workstation 110, a transceiver (or an RF transceiver) 135, a memory 137, and an array processor 139. In some embodiments, the sequence pulse generator 133 may be integrated into a resonance assembly 140 of the scanning unit 111 of the MRI system 100. The MR system controller 130 may receive a command from the operator workstation 110, and is coupled to the scanning unit 111 to indicate an MRI scanning sequence to be performed during an MRI scan, so as to be used to control the scanning unit 111 to perform the flow of the aforementioned magnetic resonance scan. The MRI system controller 130 is further coupled to and in communication with a gradient driver system 150, which is coupled to a gradient coil assembly 142 to generate a magnetic field gradient during the MRI scan.

The sequence pulse generator 133 may further receive data from a physiological acquisition controller 155, which receives signals from a number of different sensors, such as electrocardiogram (ECG) signals from electrodes attached to a patient, the sensors being connected to the subject or patient 170 undergoing an MRI scan. The sequence pulse generator 133 is coupled to and in communication with a scan room interface system 145 that receives signals from various sensors associated with the state of the resonance assembly 140. The scan room interface system 145 is further coupled to and in communication with a patient positioning system 147 that sends and receives signals to control the movement of a patient table to a desired position to perform the MRI scan.

The MRI system controller 130 provides gradient waveforms to the gradient driver system 150, and the gradient driver system includes $G_x$ (x direction), $G_y$ (y direction), and $G_z$ (z direction) amplifiers, etc. Each of the $G_x$, $G_y$, and $G_z$ gradient amplifiers excites a corresponding gradient coil in the gradient coil assembly 142, so as to generate a magnetic field gradient used to spatially encode an MR signal during an MRI scan. The gradient coil assembly 142 is disposed within the resonance assembly 140, and the resonance assembly further includes a superconducting magnet having a superconducting coil 144 that, in operation, provides a static uniform longitudinal magnetic field $B_0$ throughout a cylindrical imaging volume 146. The resonance assembly 140 further includes an RF body coil 148, which, in operation, provides a transverse magnetic field $B_1$, and the transverse magnetic field $B_1$ is substantially perpendicular to $B_0$ throughout the entire cylindrical imaging volume 146. The resonance assembly 140 may further include an RF surface coil 149 for imaging different anatomical structures of the patient undergoing the MRI scan. The RF body coil 148 and the RF surface coil 149 may be configured to operate in a transmit and receive mode, a transmit mode, or a receive mode.

The x direction may also be referred to as a frequency encoding direction or a $k_x$ direction in the k-space. The y direction may be referred to as a phase encoding direction or a $k_y$ direction in the k-space. $G_x$ can be used for frequency encoding or signal readout, and is generally referred to as a frequency encoding gradient or a readout gradient. $G_y$ can be used for phase encoding, and is generally referred to as a phase encoding gradient. $G_z$ can be used for slice (layer) position selection to acquire k-space data. It should be noted that the layer selection direction, the phase encoding direction, and the frequency encoding direction may be modified according to actual requirements.

The subject or patient 170 of the MRI scan may be positioned within the cylindrical imaging volume 146 of the resonance assembly 140. The transceiver 135 in the MRI system controller 130 generates RF excitation pulses that are amplified by an RF amplifier 162 and provided to the RF body coil 148 by means of a transmit/receive switch (T/R switch) 164.

As described above, the RF body coil 148 and the RF surface coil 149 may be used to transmit RF excitation pulses and/or receive resulting MR signals from the patient undergoing the MRI scan. The MR signals emitted by excited nuclei in the patient of the MRI scan may be sensed and received by the RF body coil 148 or the RF surface coil 149 and sent back to a preamplifier 166 by means of the T/R switch 164. The T/R switch 164 may be controlled by a signal from the sequence pulse generator 133 so as to electrically connect the RF amplifier 162 to the RF body coil 148 in the transmit mode and to connect the preamplifier 166 to the RF body coil 148 in the receive mode. The T/R switch 164 may further enable the RF surface coil 149 to be used in the transmit mode or the receive mode.

In some embodiments, the MR signals sensed and received by the RF body coil 148 or the RF surface coil 149 and amplified by the preamplifier 166 are stored in the memory 137 as a raw k-space data array for post-processing. A reconstructed magnetic resonance image may be obtained by transforming/processing the stored raw k-space data.

In some embodiments, the MR signals sensed and received by the RF body coil 148 or the RF surface coil 149 and amplified by the preamplifier 166 are demodulated, filtered, and digitized in a receiving portion of the transceiver 135, and transmitted to the memory 137 in the MRI system controller 130. For each image to be reconstructed, the data is rearranged into separate k-space data arrays, and each of said separate k-space data arrays is inputted to the array processor 139, the array processor being operated to transform the data into an array of image data by means of Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term memory, or may be further processed by the image processor 128 and transmitted to the operator workstation 110 for presentation on the display 118.

In various embodiments, components of the computer system 120 and the MRI system controller 130 may be implemented on the same computer system or on a plurality of computer systems. It should be understood that the MRI system 100 shown in FIG. 1 is intended for illustration. Suitable MRI systems may include more, fewer, and/or different components.

The MRI system controller 130 and the image processor 128 may separately or collectively include a computer processor and a storage medium. The storage medium records a predetermined data processing program to be executed by the computer processor. For example, the storage medium may store a program used to implement scanning processing (such as a scan flow and an imaging sequence), image reconstruction, image processing, etc. For example, the storage medium may store a program used to implement the magnetic resonance imaging method according to the embodiments of the present invention. The described storage medium may include, for example, a ROM, a floppy disk, a hard disk, an optical disk, a magneto-optical disk, a CD-ROM, or a non-volatile memory card.

The aforementioned "imaging sequence" (also referred to below as a scanning sequence or a pulse sequence) refers to a combination of pulses having specific amplitudes, widths, directions, and time sequences and applied when a magnetic resonance imaging scan is executed. These pulses may typically include, for example, radio-frequency pulses and gradient pulses. The radio-frequency pulses may include, for example, radio-frequency excitation pulses, radio-frequency refocusing pulses, inverse recovery pulses, etc. The gradient pulses may include, for example, the aforementioned gradient pulse used for layer selection, gradient pulse used for phase encoding, gradient pulse used for frequency encoding, gradient pulse used for phase shifting (phase shift), gradient pulse used for dispersion of phases (dephasing), etc.

Typically, a plurality of scanning sequences can be pre-set in the magnetic resonance system, so that the sequence suitable for clinical detection requirements can be selected. The clinical detection requirements may include, for example, an imaging site, an imaging function, an imaging effect, and the like.

Conventional EPI is an accelerated imaging technique. In a k-space, one echo is generated along each phase line in the k-space. In k-space acquisition, two adjacent echoes, such as a forward echo and a reverse echo, are acquired in opposite directions.

Figure 2:
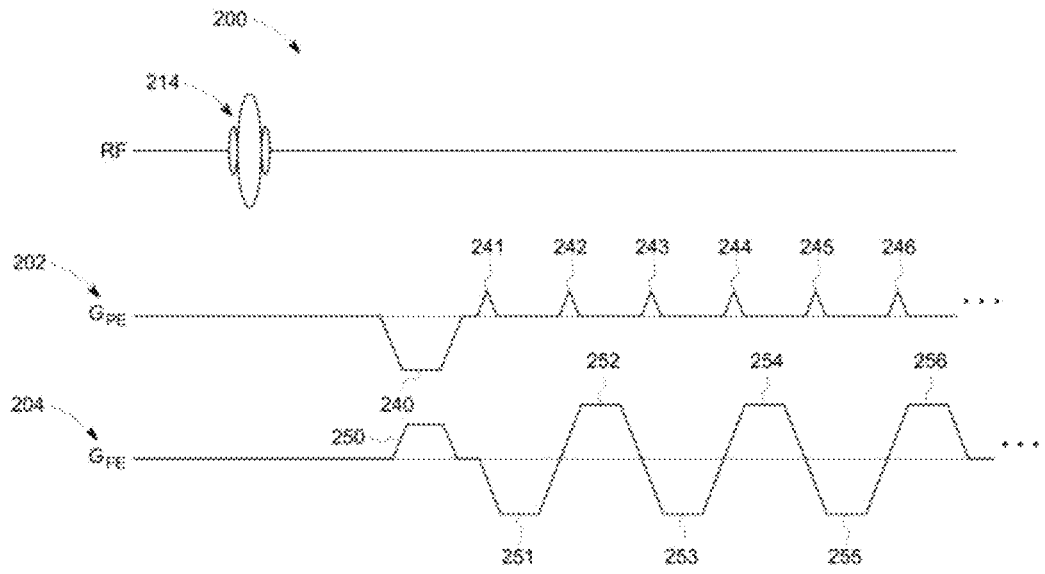
FIG. 2 and FIG. 3 are an EPI sequence and a k-space trajectory map corresponding thereto according to embodiments of the present application.
Figure 3:
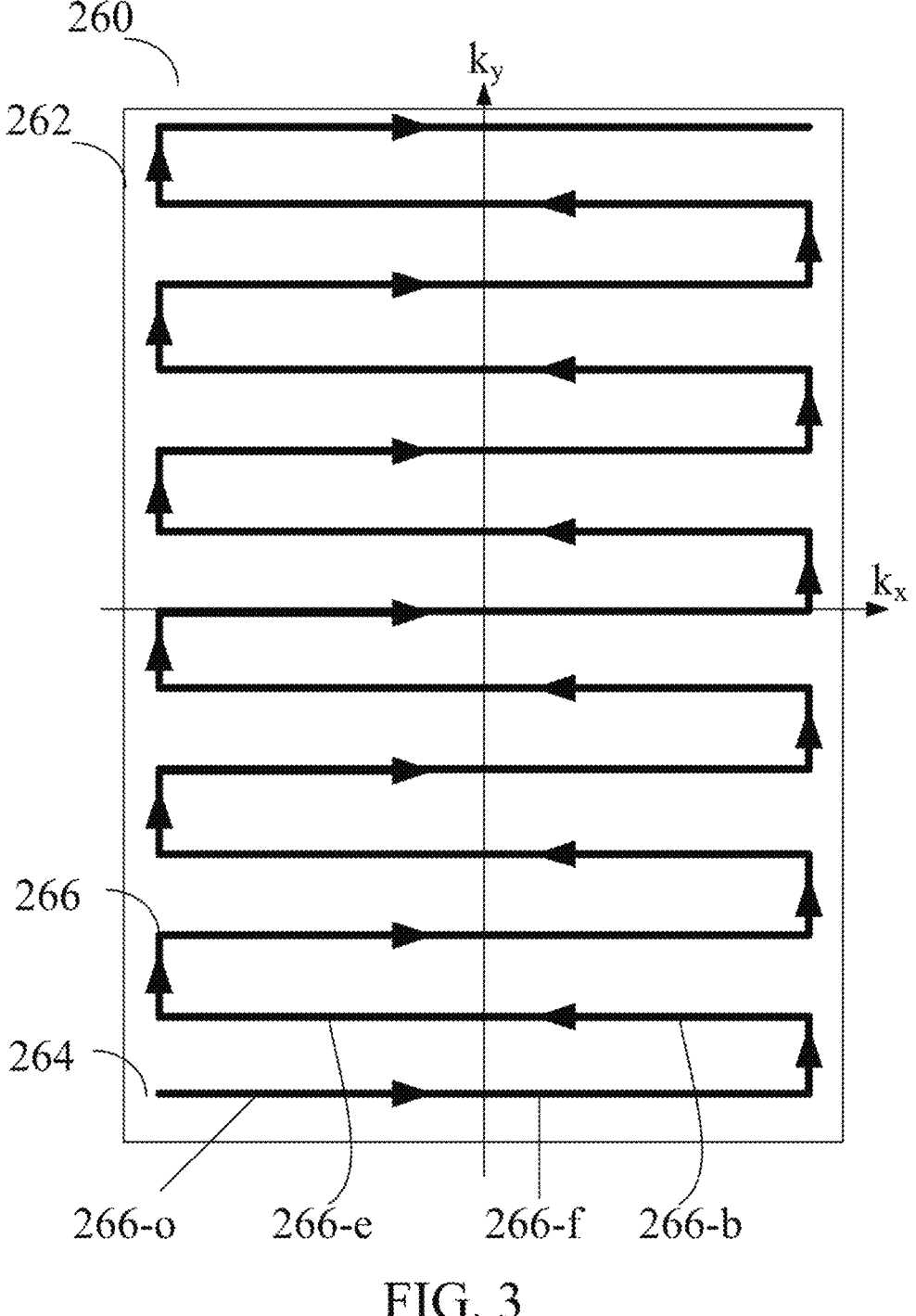

FIG. 2 and FIG. 3 show an EPI sequence 200 and a k-space trajectory 260 corresponding thereto. The k-space includes a $k_x$ axis and a $k_y$ axis. $k_x$ and $k_y$ represent spatial frequencies, and respectively correspond to a readout or frequency encoding (FE) direction and the phase encoding (PE) direction. The k-space trajectory 260 covers raw k-space data 262 displayed as an image. The EPI sequence 200 includes a radio-frequency excitation pulse 214, and a series of PE gradients $G_{PE}$ 202 and FE gradients $G_{HE}$ 204.

The series of PE gradients 202 may begin with a large gradient 240. The series of FE gradients 204 may begin with a large gradient 250. Therefore, an acquisition point in the k-space starts at a periphery 264 of the k-space. That is, the k-space trajectory or scan trajectory 260 of the pulse sequence 200 starts at a peripheral corner 264. After the large PE gradient 240, a plurality of small PE gradient "spikes" are each placed at the inversion from a positive FE gradient to a negative FE gradient or from a negative FE gradient to a positive FE gradient. For example, a spike 241 is placed at the start of a negative FE gradient 251, a spike 242 is placed at the inversion from a negative readout gradient 251 to a positive readout gradient 252, and a spike 243 is placed at the inversion from the positive readout gradient 252 to a negative readout gradient 253, and so on. The spikes are of a constant size, and each adds further phase encoding to previous spikes. The number of FE gradients 251 to 256 and the number of spikes 241 to 246 depend on the matrix size of the MR image in the phase encoding direction. The matrix size may be 64, 128, 256, or other numerical values.

In the case of the EPI pulse sequence 200, data acquired via the EPI pulse sequence includes a series of echoes, and one echo is generated for each $k_x$ line 266 of the k-space along a zig-zag trajectory running through the k-space. Each $k_x$ line 266 is scanned by means of the FE gradients 251 to 256. The PE gradient spikes 241 to 246 move the trajectory 260 from one $k_x$ line 266 to a next $k_x$ line 266. Two adjacent echoes 266-0 and 266-*e* are acquired in opposite directions. The echoes may be referred to as an odd echo 266-0 and an even echo 266-*e* depending on the order of the echoes in an echo sequence. For example, a first echo, a third echo, and a fifth echo are referred to as odd echoes 266-0, and a second echo, a fourth echo, and a sixth echo are referred to as even echoes 266-*e*. The echoes may also be referred to as a forward echo 266-*f* and a reverse echo 266-*b* depending on a scan direction in the k-space. If the forward echo 266-*f* and the reverse echo 266-*b* are not a perfect mirror image of each other, an artifact is introduced to an image during reconstruction. For example, a delay from the start of the first echo will propagate to all subsequent echoes, resulting in a timing difference between the peaks of odd and even echoes. When Fourier transform is performed, this phase error will cause signal intensity to shift in a phase-encoding direction traversing half the image, which is referred to as a Nyquist artifact. If P pixels are present in the field of view (FOV), the artifact is offset by P/2 pixels relative to a primary image located in a correct location. The Nyquist artifact may be caused by a number of possible reasons, such as eddy currents induced in a coil and a magnet housing in response to a rapid change in the gradient pulse, poor magnetic field uniformity, gradient coil heating, a gradient system delay, etc.

Currently, some Nyquist artifact suppression methods have been proposed in the related art, such as correcting the aforementioned phase error. Some methods can correct the phase error in one direction (e.g., the frequency encoding direction) (also referred to as one-dimensional (1D) phase correction). Some methods can correct the phase error in two directions (e.g., the frequency encoding direction and the phase encoding direction) (also referred to as two-dimensional (2D) phase correction). The one-dimensional phase correction and the two-dimensional phase correction are both performed by means of a phase correction coefficient obtained by performing calculation on scan data obtained by a reference scan (or a pre-scan) before a formal scan. The reference scan is performed on all slice positions, and the scan data includes scan data corresponding to all of the slice positions. Assuming a repetition time TR=F, if the one-dimensional phase correction and the two-dimensional phase correction are simultaneously performed, the time required for the reference scan is at least 2F, thereby consuming a great deal of scan time and resulting in high costs.

In view of at least one of the above problems, when a reference scan is performed, the scan does not need to be performed on all slice positions, and only a portion of slice positions are scanned. Scan data of the portion of slice positions is acquired, and phase correction coefficients corresponding to all of the slice positions are obtained according to the scan data of the portion of slice positions, thereby reducing reference scan time while suppressing Nyquist artifacts.

Description is made below in conjunction with the embodiments.

The embodiments of the present application provide a magnetic resonance scanning and imaging method. FIG. 4 is a schematic diagram of the magnetic resonance scanning and imaging method according to the embodiments of the present application. As shown in FIG. 4, the method includes: at step 401, performing a reference scan on a site to be examined, acquiring reference scan data corresponding to a portion of slice positions among a plurality of slice positions, and generating, according to the reference scan data, a phase correction coefficient corresponding to each slice position among the plurality of slice positions.

At step 402, the method includes, performing, according to the phase correction coefficients, a diagnostic scan on the site to be examined to acquire a magnetic resonance image.

In some embodiments, the reference scan includes at least one of a one-dimensional reference scan and a two-dimensional reference scan. The one-dimensional reference scan is used for one-dimensional phase correction. The two-dimensional reference scan is used for two-dimensional phase correction. One-dimensional phase correction means correcting a k-space phase error in one direction (e.g., the frequency encoding direction). Two-dimensional phase correction means correcting the aforementioned k-space phase error in two directions (e.g., the frequency encoding direction and the phase encoding direction). It may be determined as desired that only a one-dimensional reference scan and one-dimensional phase correction are performed before a formal scan, or that only a two-dimensional reference scan and two-dimensional phase correction are performed before a formal scan, or that a one-dimensional reference scan and a two-dimensional reference scan as well as one-dimensional phase correction and two-dimensional phase correction are performed before a formal scan, but the embodiments of the present application are not limited thereto. The following description is provided by using an example in which a one-dimensional reference scan and a two-dimensional reference scan are performed before a formal scan.

In some embodiments, the plurality of slice positions and the number may be configured as desired, but the embodiments of the present application are not limited thereto. For example, the plurality of slice positions are a plurality of slices in adjacent positions, and may be the same as slice positions that need to be scanned during a formal scan. Being the same includes the central position, the slice thickness, and the spacing of each slice being the same. Assuming that the number of slice positions required for the formal scan is 2N and that indexes of the 2N slice positions are respectively 1, 2, 3, 4, . . . , 2N, the plurality of slice positions are also slices 1, 2, 3, 4, . . . , 2N. However, the embodiments of the present application are not limited thereto. For example, the plurality of slice positions may also be a portion of slice positions among the 2N slice positions, such as slices 1, 2, 3, 4, . . . , N. Alternatively, the plurality of slice positions may include a portion of slice positions among the 2N slice positions and other slice positions of the same spacing, such as slices N+1, N+2, N+3, . . . , 2N, 2N+1, 2N+2, . . . , 3N. Alternatively, the plurality of slice positions may not include the 2N slice positions. For example, the plurality of slice positions include slices 2N+1, 2N+2, . . . , 4N, etc., and examples are not enumerated herein. In the above example, the number of the plurality of slice positions is 2N (N is an integer greater than or equal to 2), but the embodiments of the present application are not limited thereto, and enumeration is not further provided herein. The following description is provided by using an example in which the plurality of slice positions are slices 1, 2, 3, 4, . . . , 2N.

The foregoing slice positions are also referred to as layers, and a layer refers to any one of a plurality of two-dimensional slice positions distributed in the z direction in a three-dimensional imaging volume. In examples for illustration, the slice positions in the embodiments of the present application are two-dimensional slice positions distributed in the z direction, but the embodiments of the present application are not limited thereto. The slice positions may also be two-dimensional slices in another direction.

In some embodiments, in 401, a first pulse sequence is used to perform a one-dimensional reference scan on a first portion of slice positions of the site to be examined, and a second pulse sequence is used to perform a two-dimensional reference scan on a second portion of slice positions of the site to be examined. The first portion of slice positions and the second portion of slice positions are only some slice positions among the above-described plurality of slice positions. The first portion of slice positions is the same as or different from or not exactly the same as the second portion of slice positions. The first portion of slice positions and the second portion of slice positions include all of the plurality of slice positions, or include a portion of slice positions among the plurality of slice positions.

For example, to improve phase correction precision, the first portion of slice positions and the second portion of slice positions are arranged at intervals (alternating) among the plurality of slice positions. For example, the first portion of slice positions includes slices 1, 3, 5, . . . , 2N−1, and the second portion of slice positions includes slices 2, 4, 6, . . . , 2N, and vice versa. Alternatively, for example, the first portion of slice positions includes slices 1, 4, 7, . . . , and the second portion of slice positions includes slices 2, 5, 8, . . . , and vice versa. Examples are not further enumerated herein.

FIG. 5 is a schematic diagram of the first pulse sequence according to the embodiments of the present application. As shown in FIG. 5, the first pulse sequence includes a radio-frequency excitation pulse 51, a first gradient pulse 52 for layer selection, and a second gradient pulse 53 for frequency encoding. For example, the waveform of the radio-frequency excitation pulse 51 may be a sinc wave. A flip angle of the radio-frequency excitation pulse 51 may be set to 90°, or may be set to another value. The waveform of the pulse may also be configured to be another shape. The embodiments of the present application are not limited thereto. The first gradient pulse 52 and the radio-frequency excitation pulse 51 may be applied simultaneously. The first gradient pulse 52 may be applied in the z direction by the gradient coil assembly. By means of the first gradient pulse 52, a magnetic field gradient is applied to a slice selection direction (e.g., the z direction), so that precession frequencies of protons of an imaged tissue in different layers (also referred to as slice positions) of this region are different. When an imaging region is scanned, an excitation frequency of the radio-frequency excitation pulse 51 is set, and a layer having a precession frequency corresponding to the radio-frequency excitation pulse 51 is excited, so as to implement layer selection (the first portion of slice positions is selected). For example, the first portion of slice positions is selected by means of setting a suitable excitation frequency of the radio-frequency excitation pulse 51 and the first gradient pulse 52. The Larmor frequency $\omega_z$ at each slice position is related to the position thereof in the z direction and a gradient magnetic field, as shown in equation (1) below:

$$\omega_z = \gamma(B_0 + z \times Gz) \tag{1}$$

where $\gamma$ represents a gyromagnetic ratio, and $B_0$ represents static magnetic field strength.

Since the gradient magnetic field Gz is applied, the Larmor frequency of each slice position in the z direction is different. Thus, after the first portion of slice positions z1 is determined, the excitation frequency is determined according to each of the first portion of slice positions and the gradient strength of the gradient pulse. For example, the excitation frequencies f1 of the first portion of slice positions (equal to the Larmor frequencies corresponding to the first portion of slice positions) can be determined according to formula (1), and the excitation frequencies of the radio-frequency excitation pulse 51 and the first gradient pulse 52 are set according to f1 obtained by calculation and Gz, thereby exciting the corresponding first portion of slice positions.

FIG. 6 is a schematic diagram of the second pulse sequence according to the embodiments of the present application. As shown in FIG. 6, the second pulse sequence includes a radio-frequency excitation pulse 61, a first gradient pulse 62 for layer selection, a second gradient pulse 63 for frequency encoding, and a third gradient pulse 64 for phase encoding. That is, when a two-dimensional reference scan is performed, the third gradient pulse 64 for phase encoding needs to be additionally applied in addition to the pulse sequence used in the one-dimensional reference scan. For example, the waveform of the radio-frequency excitation pulse 61 may be a sine wave. A flip angle of the radio-frequency excitation pulse 61 may be set to 90°. The pulse and the flip angle may also be set to other values. The waveform of the pulse may also be configured to be another shape. The embodiments of the present application are not limited thereto. The first gradient pulse 62 and the radio-frequency excitation pulse 61 are applied simultaneously. The first gradient pulse 62 may be applied in the z direction by the gradient coil assembly. By means of the first gradient pulse 62, a magnetic field gradient is applied to a slice selection direction (e.g., the z direction), so that precession frequencies of protons of an imaged tissue in different layers (also referred to as slice positions) of this region are different. When the imaging region is scanned, an excitation frequency of the radio-frequency excitation pulse 61 is set, and a layer having a precession frequency corresponding to the radio-frequency excitation pulse 61 is excited, so as to implement layer selection (the second portion of slice positions is selected). For example, the second portion of slice positions is selected by means of setting suitable excitation frequencies f2 of the radio-frequency excitation pulse 61 and the first gradient pulse 62. That is, after the second portion of slice positions 22 is determined, for example, the excitation frequencies f2 of the second portion of slice positions (equal to the Larmor frequencies corresponding to the second portion of slice positions) can be determined according to formula (1), and the excitation frequencies of the radio-frequency excitation pulse 61 and the first gradient pulse 62 are set according to f2 obtained by calculation and Gz, thereby exciting the corresponding second portion of slice positions.

In some embodiments, in 401, a one-dimensional reference scan is performed on the first portion of slice positions of the site to be examined, one-dimensional reference scan data corresponding to the first portion of slice positions is acquired, and a first phase correction coefficient corresponding to each slice position among the plurality of slice positions is generated according to the one-dimensional reference scan data. FIG. 7 is a schematic diagram of a method for determining a first phase correction coefficient according to the embodiments of the present application.

As shown in FIG. 7, the method includes: at step 701, generating, according to the one-dimensional reference scan data, a first phase correction coefficient corresponding to each of the first portion of slice positions. At step 702, the method includes determining, according to the first phase correction coefficients corresponding to the first portion of slice positions, first phase correction coefficients corresponding to an unscanned third portion of slice positions among the plurality of slice positions.

In some embodiments, in 701, for one slice position among the first portion of slice positions, the one slice position among the first portion of slice positions is excited by means of the first pulse sequence, and an MR signal is acquired. The first pulse sequence does not include the gradient pulse for phase encoding, so that after spatial encoding, an odd row (one row) of data and an even row (one row) of data can be obtained. A phase difference between a phase of a curve corresponding to the even row of data and a phase corresponding to the odd row of data is calculated to obtain a phase difference curve. Linear fitting is performed on a first slope of the phase difference curve, and the first slope is used as the first phase correction coefficient corresponding to the one slice position among the first portion of slice positions.

In the above description, one slice position among the first portion of slice positions is used as an example to describe how to determine the first phase correction coefficient corresponding to the one slice position among the first portion of slice positions. The method for determining the first phase correction coefficient corresponding to each slice position among the first portion of slice positions is the same, and details will not be described herein again. In addition, the foregoing method for determining the first phase correction coefficient is merely an example for description, and the present application is not limited thereto. Reference may be made to the related art for details.

Figure 13:
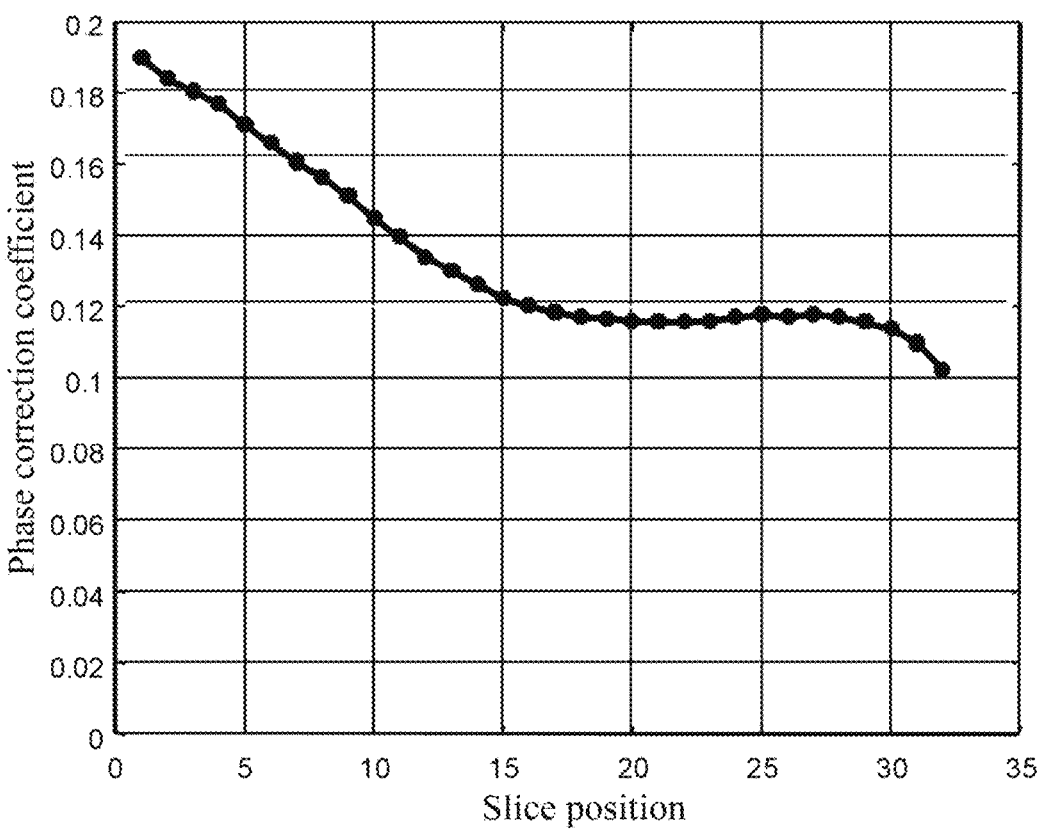
FIG. 13 is a schematic diagram of phase correction coefficients of different slice positions according to embodiments of the present application.

In some embodiments, in 702, high-order polynomial fitting is performed on the first phase correction coefficients corresponding to the first portion of slice positions to obtain a fitted first fit function so as to determine the first phase correction coefficients corresponding to the third portion of slice positions. FIG. 13 is a schematic diagram of the phase correction coefficients of different slice positions according to the embodiments of the present application. The inventor found that the eddy current changes very slowly as the slice position changes. As shown in FIG. 13, the phase correction coefficient changes smoothly as the slice position changes. Therefore, the first phase correction coefficients corresponding to the unscanned third portion of slice positions among the plurality of slice positions can be obtained according to the high-order polynomial fitting (e.g., third-order or greater) of the first phase correction coefficients of the first portion of slice positions. For example, high-order polynomial fitting is performed on the first phase correction coefficients corresponding to the first portion of slice positions to obtain a first fit function. An independent variable of the first fit function is the slice position, and a dependent variable function value is the first phase correction coefficient. The first fit function defines the correspondence between each slice position and the first phase correction coefficients, so that the first phase correction coefficients corresponding to the unscanned third portion of slice positions can be obtained. That is, a discrete point set including the first portion of slice positions and corresponding to the first phase correction coefficients is established. A continuous function of a continuous set is acquired by performing fitting on the basis of the discrete point set. The discrete point set is included in the continuous set. The first phase correction coefficients corresponding to the unscanned third portion of slice positions can be acquired by means of the fitted first fit function (a continuous function). That is, not limited to the plurality of slice positions, the first fit function is a high-order function capable of reflecting the correspondence between each slice position in a three-dimensional space and the first phase correction coefficient. For a high-order polynomial fitting method, reference may be made to the prior art. The embodiments of the present application are not limited thereto.

In some implementations, in 401, a two-dimensional reference scan is performed on the second portion of slice positions of the site to be examined, two-dimensional reference scan data corresponding to the second portion of slice positions is acquired, and a second phase correction coefficient corresponding to each slice position among the plurality of slice positions is generated according to the two-dimensional reference scan data.

FIG. 8 is a schematic diagram of a method for determining a second phase correction coefficient according to the embodiments of the present application. As shown in FIG. 8, the method includes: at step 801, generating, according to the two-dimensional reference scan data, a second phase correction coefficient corresponding to each of the second portion of slice positions; and at step 802, determining, according to the second phase correction coefficients corresponding to the second portion of slice positions, second phase correction coefficients corresponding to an unscanned fourth portion of slice positions among the plurality of slice positions.

In some embodiments, in 801, for one slice position among the second portion of slice positions, the one slice position among the second portion of slice positions is excited by means of a second pulse sequence, an MR signal is acquired, and after spatial encoding, the signal is filled into a k-space to obtain second reference k-space data, the second reference k-space data being k-space data having an FOV in the phase encoding direction that is two or more times the field of view (FOVy) of a magnetic resonance image to be corrected. FOVx in the x direction or the readout (frequency encoding) direction is the same in a reference scan as in a formal diagnostic scan. In order to acquire the second reference k-space data, the gradient strength of the third gradient pulse 64 in the second pulse sequence is half or less than half of the gradient strength of a fourth gradient pulse in a third pulse sequence used in the formal diagnostic scan. The third pulse sequence will be described in the following description.

Figure 10:
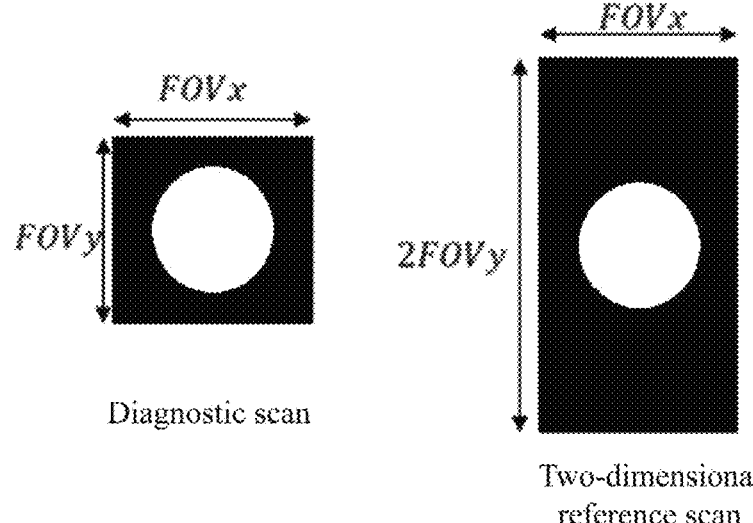
FIG. 10 is a schematic diagram of an image FOV according to embodiments of the present application.

FIG. 9 is a schematic diagram of a third gradient pulse and a fourth gradient pulse according to the embodiments of the present application. As shown in FIG. 9, the gradient strength of the third gradient pulse 64 is half of the gradient strength of the fourth gradient pulse 90. FIG. 10 is a schematic diagram of a corresponding image FOV according to the embodiments of the present application. As shown in FIG. 10, FOVy of a reference scan in phase encoding is twice FOVy of a formal diagnostic scan, and FOVx in the x direction is the same. FIG. 9 and FIG. 10 are used as examples below to describe how to determine the second phase correction coefficient.

Figure 11:
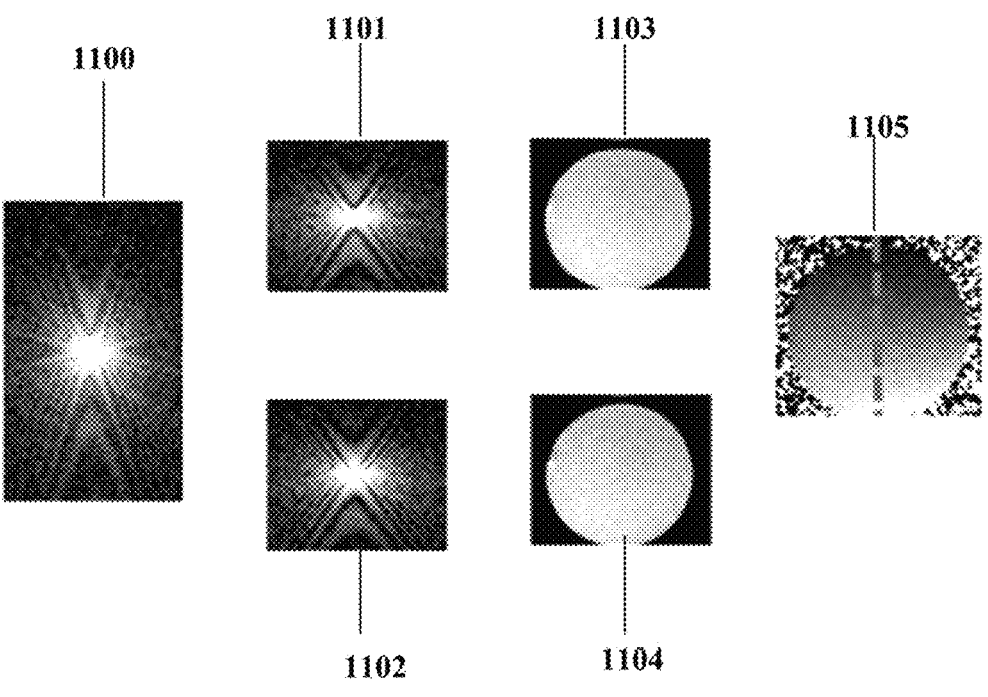
FIG. 11 is a schematic diagram of determining a second phase correction coefficient according to embodiments of the present application.

In some embodiments, FIG. 11 is a schematic diagram of acquiring the second phase correction coefficient according to the embodiments of the present application. As shown in FIG. 11, second reference k-space data 1100 is divided into an odd row of k-space data 1101 and an even row of k-space data 1102. The odd row of k-space data 1101 and the even row of k-space data 1102 may respectively correspond to images 1103 and 1104 of a single-fold FOVy. The difference between a phase of the odd row of k-space data (which may be a half-pixel shift) and a phase of the even row of k-space data (which may be a half-pixel shift) is calculated to obtain a phase difference map 1105. Linear fitting is performed on the phase difference map 1105 to obtain a second slope, and the second slope is used as the second phase correction coefficient corresponding to the one slice position among the second portion of slice positions.

In the above description, one slice position among the second portion of slice positions is used as an example to describe how to determine the second phase correction coefficient corresponding to the one slice position among the second portion of slice positions. The method for determining the second phase correction coefficient corresponding to each slice position among the second portion of slice positions is the same, and details will not be described herein again. In addition, the foregoing method for determining the second phase correction coefficient is merely an example for description, and the present application is not limited thereto. Reference may be made to the related art for details.

In some embodiments, in 802, high-order polynomial fitting is performed on the second phase correction coefficients corresponding to the second portion of slice positions to obtain a fitted second fit function so as to determine the first phase correction coefficients corresponding to the fourth portion of slice positions. Similarly, as in FIG. 13, the phase correction coefficient changes smoothly as the slice position changes. Therefore, the second phase correction coefficients corresponding to the unscanned fourth portion of slice positions among the plurality of slice positions can be obtained according to the high-order polynomial fitting (e.g., third-order or greater) of the second phase correction coefficients of the second portion of slice positions. For example, high-order polynomial fitting is performed on the second phase correction coefficients corresponding to the second portion of slice positions to obtain a second fit function. An independent variable of the second fit function is the slice position, and a dependent variable function value is the second phase correction coefficient. The second fit function defines the correspondence between each slice position and the second phase correction coefficient, so that the second phase correction coefficients corresponding to the unscanned fourth portion of slice positions can be obtained. That is, a discrete point set including the second portion of slice positions and corresponding to the second phase correction coefficients is established. A continuous function of a continuous set is acquired by performing fitting on the basis of the discrete point set. The discrete point set is included in the continuous set. The second phase correction coefficients corresponding to the unscanned fourth portion of slice positions can be acquired by means of the fitted second fit function (a continuous function). That is, not limited to the plurality of slice positions, the second fit function is a high-order function capable of reflecting the correspondence between each slice position in a three-dimensional space and the second phase correction coefficient. For a high-order polynomial fitting method, reference may be made to the prior art. The embodiments of the present application are not limited thereto.

It should be noted that the third portion of slice positions are other slice positions among the plurality of slice positions excluding the first portion of slice positions. For example, the third portion of slice positions may include the second portion of slice positions. The fourth portion of slice positions are other slice positions among the plurality of slice positions excluding the second portion of slice positions. For example, the fourth portion of slice positions may include the first portion of slice positions. When the first portion of slice positions and the second portion of slice positions are arranged at intervals among the plurality of slice positions, the first portion of slice positions are equivalent to the fourth portion of slice positions, and the second portion of slice positions are equivalent to the third portion of slice positions.

In some embodiments, in 402, the third pulse sequence is preprocessed according to the phase correction coefficients before a scan, or data is post-processed after a scan and data acquisition, or both preprocessing and post-processing are performed, so as to acquire a magnetic resonance image from which the Nyquist artifact has been removed.

In some embodiments, when a formal diagnostic scan is performed, the third pulse sequence is used to perform a scan in M (M is an integer greater than one) slice positions of the site to be examined. The M slice positions may be set by using a scan parameter in the system. For example, the M slice positions may be the aforementioned plurality of slice positions, such as slices 1, 2, 3, . . . , 2N, but the embodiments of the present application are not limited thereto. For example, the M slice positions may be a portion of slice positions among the aforementioned plurality of slice positions, or some of the M slice positions coincide with the plurality of slice positions, or the M slice positions are different from the plurality of slice positions (however, the layer thickness of each layer and the layer spacing are the same as those of the plurality of slice positions), and examples are not further enumerated herein.

In some embodiments, in 401 described above, the high-order function reflecting the correspondence between each slice position in a three-dimensional space and the phase correction coefficient can be acquired by performing the fitting on the phase correction coefficients of the portion of slice positions. In 402, phase correction coefficients corresponding to the M slice positions can be obtained by inputting the M slice positions as the independent variable into the high-order function, and include, for example, first phase correction coefficients $P_{M1}$ or second phase correction coefficients $P_{M2}$.

In some embodiments, the third pulse sequence is a scanning sequence used in a formal diagnostic scan. The third pulse sequence includes a radio-frequency excitation pulse, a first gradient pulse for layer selection, a second gradient pulse for frequency encoding, and a fourth gradient pulse for phase encoding. The gradient strength of the fourth gradient pulse is positively correlated with the gradient strength of the third gradient pulse. For example, the gradient strength of the fourth gradient pulse and twice the gradient strength of the third gradient pulse.

For example, the waveform of the radio-frequency excitation pulse may be a sinc wave. A flip angle of the radio-frequency excitation pulse may be set to 90°. The pulse and the flip angle may also be set to other values. The waveform of the pulse may also be configured to be another shape. The embodiments of the present application are not limited thereto. The first gradient pulse and the radio-frequency excitation pulse are applied simultaneously. The first gradient pulse may be applied in the z direction by the gradient coil assembly. By means of the first gradient pulse, a magnetic field gradient is applied to a slice selection direction (e.g., the z direction), so that precession frequencies of protons of an imaged tissue in different layers (also referred to as slice positions) of this region are different. When the imaging region is scanned, an excitation frequency of the radio-frequency excitation pulse is set, and a layer having a precession frequency corresponding to the radio-frequency excitation pulse is excited, so as to implement layer selection (the M slice positions are selected). That is, the M slice positions are selected by means of setting suitable excitation frequencies of the radio-frequency excitation pulse and the first gradient pulse. For example, the excitation frequencies (equal to the Larmor frequencies corresponding to the first portion of slice positions) f3 of the M slice positions can be determined according to formula (1), and the excitation frequencies of the radio-frequency excitation pulse and the first gradient pulse are set according to f3 obtained by calculation and Gz, thereby exciting the corresponding M slice positions.

In some embodiments, in 402, the third pulse sequence is processed according to the second phase correction coefficients, the processed third pulse sequence is used to perform a diagnostic scan on the site to be examined, and k-space data is acquired; and then, the k-space data is processed according to the first phase correction coefficients, and the processed k-space data is used to generate the magnetic resonance image. Regarding how to acquire k-space data and reconstruct a magnetic resonance image, reference may be made to the prior art, and details will not be described herein again.

For example, preprocessing the third pulse sequence according to the second phase correction coefficients includes: multiplying the second phase correction coefficients $P_{M2}$ corresponding to the M slice positions by the fourth gradient pulse in the third pulse sequence, i.e., using the second phase correction coefficients $P_{M2}$ to correct (pre-compensate) a phase encoding gradient, thereby correcting the phase error.

For example, post-processing the k-space data according to the first phase correction coefficients includes: adding the first phase correction coefficients $P_{M1}$ corresponding to the M slice positions and a phase corresponding to the odd row of data in the k-space data corresponding to each slice position, i.e., using the first phase correction coefficients $P_{M1}$ to correct the phase, thereby correcting the phase error.

It should be noted that the embodiments of the present application are not limited to the foregoing preprocessing and post-processing processes, and specific processing implementations may correspond to respective methods for determining a phase correction coefficient. Reference may be made to the related art, and examples are not further enumerated herein.

The first pulse sequence, the second pulse sequence, and the third pulse sequence may be a single-shot EPI sequence. An entire 2D slice is acquired after a single radio-frequency excitation pulse. Alternatively, the EPI sequence may be a multi-shot EPI sequence, and a 2D plane is acquired by using a plurality of radio-frequency excitation pulses, but the embodiments of the present application are not limited thereto.

In some embodiments, if switching to a next scan subject to be scanned, then the aforementioned scanning and imaging method is performed again.

By means of the above embodiments, when a reference scan is performed, the scan does not need to be performed on all slice positions, and only a portion of slice positions are scanned. Scan data of the portion of slice positions is acquired, and phase correction coefficients corresponding to all of the slice positions are obtained according to the scan data of the portion of slice positions, thereby reducing reference scan time while suppressing Nyquist artifacts. For example, when the number of slice positions in the portion of slice positions is half the number of the plurality of slice positions, half of the reference scan time can be saved.

An embodiment of the present application further provides a magnetic resonance imaging system. The configuration of the magnetic resonance imaging system is as shown in FIG. 1, and similarities are not repeated here.

In some embodiments, the magnetic resonance imaging system differs from the magnetic resonance imaging system in FIG. 1 in that the controller 130 is further configured to control the scanning unit to perform a reference scan on a site to be examined, acquire reference scan data corresponding to a portion of slice positions among a plurality of slice positions, and generate, according to the reference scan data, a phase correction coefficient corresponding to each slice position among the plurality of slice positions; and perform, according to the phase correction coefficients, a diagnostic scan on the site to be examined to acquire a magnetic resonance image.

In some embodiments, the controller 130 (which may also be referred to as a processor) includes a computer processor and a storage medium. The storage medium records thereon a predetermined data processing program to be executed by the computer processor. For example, the storage medium may store a program used to implement scan processing (e.g., including waveform design/conversion, etc.), image reconstruction, image processing, etc., and may store, for example, a program used to implement the phase correction coefficient determination method according to the embodiments of the present invention. The phase correction coefficient determination method includes acquiring reference scan data corresponding to a portion of slice positions among a plurality of slice positions, and generating, according to the reference scan data, a phase correction coefficient corresponding to each slice position among the plurality of slice positions. The storage medium may include, for example, a ROM, a floppy disk, a hard disk, an optical disk, a magneto-optical disk, a CD-ROM, or a non-volatile memory card.

Figure 12:
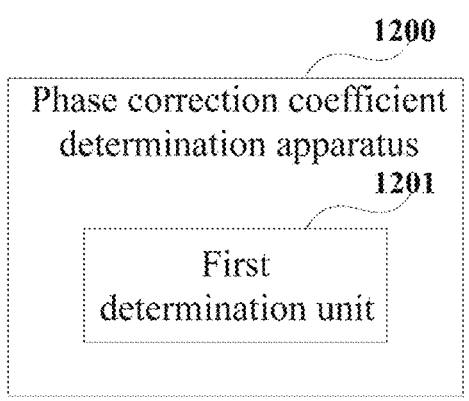
FIG. 12 is a schematic diagram of a phase correction coefficient determination apparatus according to embodiments of the present application.

The embodiments of the present application further provide a phase correction coefficient determination apparatus. FIG. 12 is a schematic diagram of a phase correction coefficient determination apparatus according to the embodiments of the present application. As shown in FIG. 12, the apparatus 1200 includes:

a first determination unit 1201, for acquiring reference scan data corresponding to a portion of slice positions among a plurality of slice positions, and generating, according to the reference scan data, a phase correction coefficient corresponding to each slice position among the plurality of slice positions.

Implementations of the first determination unit 1201 are as described previously, and will not be repeated here.

The embodiments of the present application further provide a computer-readable program, which, when executed in an apparatus or an MRI system, causes a computer to perform, in the apparatus or the MRI system, the magnetic resonance scanning and imaging method according to the foregoing embodiments.

The embodiments of the present application further provide a storage medium having a computer-readable program stored therein, the computer-readable program causing a computer to perform, in an apparatus or an MRI system, the magnetic resonance scanning and imaging method according to the foregoing embodiments.

The above apparatus and method of the present application can be implemented by hardware, or can be implemented by hardware in combination with software. The present application relates to the foregoing type of computer-readable program. When executed by a logic component, the program causes the logic component to implement the foregoing apparatus or a constituent component, or causes the logic component to implement various methods or steps as described above. The present application further relates to a storage medium for storing the above program, such as a hard disk, a disk, an optical disk, a DVD, a flash memory, etc.

The method/apparatus described in view of the embodiments of the present application may be directly embodied as hardware, a software module executed by a processor, or a combination of the two. For example, one or more of the functional block diagrams and/or one or more combinations of the functional block diagrams shown in the drawings may correspond to either respective software modules or respective hardware modules of a computer program flow. The foregoing software modules may respectively correspond to the steps shown in the figures. The foregoing hardware modules can be implemented, for example, by firming the software modules by using a field-programmable gate array (FPGA).

The software modules may be located in a RAM, a flash memory, a ROM, an EPROM, an EEPROM, a register, a hard disk, a portable storage disk, a CD-ROM, or any other form of storage medium known in the art. The storage medium may be coupled to a processor, so that the processor can read information from the storage medium and can write information into the storage medium. Alternatively, the storage medium may be a constituent component of the processor. The processor and the storage medium may be located in an ASIC. The software module may be stored in a memory of a mobile terminal, and may also be stored in a memory card that can be inserted into a mobile terminal. For example, if a device (such as a mobile terminal) uses a large-capacity MEGA-SIM card or a large-capacity flash memory device, the software modules can be stored in the MEGA-SIM card or the large-capacity flash memory device.

One or more of the functional blocks and/or one or more combinations of the functional blocks shown in the accompanying drawings may be implemented as a general-purpose processor, a digital signal processor (DSP), an application-specific integrated circuit (ASIC), a field-programmable gate array (FPGA) or other programmable logic devices, discrete gate or transistor logic devices, a discrete hardware assembly, or any appropriate combination thereof for implementing the functions described in the present application. The one or more functional blocks and/or the one or more combinations of the functional blocks shown in the accompanying drawings may also be implemented as a combination of computing devices, such as a combination of a DSP and a microprocessor, multiple microprocessors, one or more microprocessors in communication combination with a DSP, or any other such configuration.

The present application is described above with reference to specific embodiments. However, it should be clear to those skilled in the art that the foregoing description is merely illustrative and is not intended to limit the scope of protection of the present application. Various variations and modifications may be made by those skilled in the art according to the principle of the present application, and said variations and modifications also fall within the scope of the present application.

The invention claimed is:

1. A magnetic resonance scanning and imaging method, characterized in that the method comprises:

performing a reference scan on a site to be examined, acquiring reference scan data corresponding to a portion of slice positions among a plurality of slice positions, and generating, according to the reference scan data, a phase correction coefficient corresponding to each slice position among the plurality of slice positions; and performing, according to the phase correction coefficients, a diagnostic scan on the site to be examined to acquire a magnetic resonance image; and wherein the step of performing the reference scan on the site to be examined, acquiring the reference scan data corresponding to the portion of slice positions among the plurality of slice positions, and generating, according to the reference scan data, the phase correction coefficient corresponding to each slice position among the plurality of slice positions comprises:

performing a one-dimensional reference scan on the site to be examined, acquiring one-dimensional reference scan data corresponding to a first portion of slice positions among the plurality of slice positions, and generating, according to the one-dimensional reference scan data, a first phase correction coefficient corresponding to each slice position among the plurality of slice positions; and performing a two-dimensional reference scan on the site to be examined, acquiring two-dimensional reference scan data corresponding to a second portion of slice positions among the plurality of slice positions, and generating, according to the two-dimensional reference scan data, a second phase correction coefficient corresponding to each slice position among the plurality of slice positions.

2. The method according to claim 1, wherein the step of generating, according to the one-dimensional reference scan data, the first phase correction coefficient corresponding to each slice position among the plurality of slice positions comprises:

generating, according to the one-dimensional reference scan data, the first phase correction coefficient corresponding to each of the first portion of slice positions; and determining, according to the first phase correction coefficients corresponding to the first portion of slice positions, first phase correction coefficients corresponding to an unscanned third portion of slice positions among the plurality of slice positions;

and the step of generating, according to the two-dimensional reference scan data, the second phase correction coefficient corresponding to each slice position among the plurality of slice positions comprises:

generating, according to the two-dimensional reference scan data, the second phase correction coefficient corresponding to each of the second portion of slice positions; and determining, according to the second phase correction coefficients corresponding to the second portion of slice positions, second phase correction coefficients corresponding to an unscanned fourth portion of slice positions among the plurality of slice positions.

3. The method according to claim 2, wherein the step of determining, according to the first phase correction coefficients corresponding to the first portion of slice positions, first phase correction coefficients corresponding to an unscanned third portion of slice positions among the plurality of slice positions comprises:

performing high-order polynomial fitting on the first phase correction coefficients corresponding to the first portion of slice positions to obtain a fitted first fit function, so as to determine the first phase correction coefficients corresponding to the third portion of slice positions;

and the step of determining, according to the second phase correction coefficients corresponding to the second portion of slice positions, second phase correction coefficients corresponding to an unscanned fourth portion of slice positions among the plurality of slice positions comprises:

performing high-order polynomial fitting on the second phase correction coefficients corresponding to the second portion of slice positions to obtain a fitted second fit function, so as to determine first phase correction coefficients corresponding to the fourth portion of slice positions.

4. The method according to claim 1, wherein the first portion of slice positions and the second portion of slice positions are arranged at intervals among the plurality of slice positions.

5. The method according to claim 1, wherein the step of performing, according to the phase correction coefficients, the diagnostic scan on the site to be examined comprises:

processing a third pulse sequence according to the second phase correction coefficients, using the processed third pulse sequence to perform the diagnostic scan on the site to be examined, and acquiring k-space data; and processing the k-space data according to the first phase correction coefficients, and using the processed k-space data to generate the magnetic resonance image.

6. The method according to claim 1, wherein a first pulse sequence is configured to perform the one-dimensional reference scan on the first portion of slice positions of the site to be examined; and a second pulse sequence is configured to perform the two-dimensional reference scan on the second portion of slice positions of the site to be examined.

7. The method according to claim 6, wherein the first pulse sequence comprises: a radio-frequency excitation pulse, a first gradient pulse for layer selection, and a second gradient pulse for frequency encoding; and the second pulse sequence comprises: a radio-frequency excitation pulse, a first gradient pulse for layer selection, a second gradient pulse for frequency encoding, and a third gradient pulse for phase encoding.

8. The method according to claim 7, wherein the third pulse sequence comprises: a radio-frequency excitation pulse, a first gradient pulse for layer selection, a second gradient pulse for frequency encoding, and a fourth gradient pulse for phase encoding, the gradient strength of the fourth gradient pulse being twice the gradient strength of the third gradient pulse.

9. A computer-readable storage medium, comprising a stored computer program, wherein the magnetic resonance scanning and imaging method according to claim 1 is performed when the computer program is run.

10. A magnetic resonance imaging system, characterized in that the system comprises:

a scanning unit; and a controller, configured to control the scanning unit to perform a reference scan on a site to be examined, acquire reference scan data corresponding to a portion of slice positions among a plurality of slice positions, and generate, according to the reference scan data, a phase correction coefficient corresponding to each slice position among the plurality of slice positions; and perform, according to the phase correction coefficients, a diagnostic scan on the site to be examined to acquire a magnetic resonance image; and wherein the controller performs a one-dimensional reference scan on the site to be examined, acquires one-dimensional reference scan data corresponding to a first portion of slice positions among the plurality of slice positions, and generates, according to the one-dimensional reference scan data, a first phase correction coefficient corresponding to each slice position among the plurality of slice positions; and performs a two-dimensional reference scan on the site to be examined, acquires two-dimensional reference scan data corresponding to a second portion of slice positions among the plurality of slice positions, and generates, according to the two-dimensional reference scan data, a second phase correction coefficient corresponding to each slice position among the plurality of slice positions.

11. The system according to claim 10, wherein the controller generates, according to the one-dimensional reference scan data, the first phase correction coefficient corresponding to each of the first portion of slice positions; determines, according to the first phase correction coefficients corresponding to the first portion of slice positions, first phase correction coefficients corresponding to an unscanned third portion of slice positions among the plurality of slice positions; generates, according to the two-dimensional reference scan data, the second phase correction coefficient corresponding to each of the second portion of slice positions; and determines, according to the second phase correction coefficients corresponding to the second portion of slice positions, second phase correction coefficients corresponding to an unscanned fourth portion of slice positions among the plurality of slice positions.

12. The system according to claim 11, wherein the controller performs high-order polynomial fitting on the first phase correction coefficients corresponding to the first portion of slice positions to obtain a fitted first fit function, so as to determine the first phase correction coefficients corresponding to the third portion of slice positions; and performs high-order polynomial fitting on the second phase correction coefficients corresponding to the second portion of slice positions to obtain a fitted second fit function, so as to determine first phase correction coefficients corresponding to the fourth portion of slice positions.

13. The system according to claim 11, wherein the first portion of slice positions and the second portion of slice positions are arranged at intervals among the plurality of slice positions.

14. The system according to claim 11, wherein the controller processes a third pulse sequence according to the second phase correction coefficients, and controls the scanning unit to use the processed third pulse sequence to perform the diagnostic scan on the site to be examined, and acquire k-space data; and the controller processes the k-space data according to the first phase correction coefficients, and uses the processed k-space data to generate the magnetic resonance image.

15. The system according to claim 11, wherein the scanning unit uses a first pulse sequence to perform the one-dimensional reference scan on the first portion of slice positions of the site to be examined; and the scanning unit uses a second pulse sequence to perform the two-dimensional reference scan on the second portion of slice positions of the site to be examined.

16. The system according to claim 15, wherein the first pulse sequence comprises: a radio-frequency excitation pulse, a first gradient pulse for layer selection, and a second gradient pulse for frequency encoding; and the second pulse sequence comprises: a radio-frequency excitation pulse, a first gradient pulse for layer selection, a second gradient pulse for frequency encoding, and a third gradient pulse for phase encoding.

17. The system according to claim 16, wherein the third pulse sequence comprises: a radio-frequency excitation pulse, a first gradient pulse for layer selection, a second gradient pulse for frequency encoding, and a fourth gradient pulse for phase encoding, the gradient strength of the fourth gradient pulse being twice the gradient strength of the third gradient pulse.

* * * * *